(12) United States Patent
Tustaniwskyi et al.

(10) Patent No.: US 7,243,704 B2
(45) Date of Patent: Jul. 17, 2007

(54) MECHANICAL ASSEMBLY FOR REGULATING THE TEMPERATURE OF AN ELECTRONIC DEVICE, HAVING A SPRING WITH ONE SLIDEABLE END

(75) Inventors: Jerry Ihor Tustaniwskyi, Mission Viejo, CA (US); James Wittman Babcock, Escondido, CA (US); Henry Jen Kuo, Yorba Linda, CA (US)

(73) Assignee: Delta Design, Inc., Poway, CA (US)

( * ) Notice: Subject to any disclaimer, the term of this patent is extended or adjusted under 35 U.S.C. 154(b) by 422 days.

(21) Appl. No.: 10/992,308

(22) Filed: Nov. 18, 2004

(65) Prior Publication Data

US 2006/0102999 A1    May 18, 2006

(51) Int. Cl.
*F28F 7/02* (2006.01)

(52) U.S. Cl. ..................... 165/80.2; 165/185
(58) Field of Classification Search ............... 165/80.1, 165/80.2, 80.4, 80.5, 185; 361/704
See application file for complete search history.

(56) References Cited

U.S. PATENT DOCUMENTS

| | | | |
|---|---|---|---|
| 4,791,983 A * | 12/1988 | Nicol et al. ................. | 166/80.4 |
| 5,880,930 A * | 3/1999 | Wheaton .................... | 165/80.3 |
| 6,116,331 A | 9/2000 | Tustaniwskyj et al. | |
| 6,323,665 B1 * | 11/2001 | Johnson et al. ............. | 324/760 |
| 6,501,658 B2 * | 12/2002 | Pearson et al. ............. | 361/709 |
| 6,774,661 B1 | 8/2004 | Tustaniwskyj et al. | |
| 2002/0030972 A1 * | 3/2002 | Ali et al. .................... | 361/704 |
| 2005/0270742 A1 * | 12/2005 | Brewer et al. ............. | 361/696 |

* cited by examiner

*Primary Examiner*—Teresa J. Walberg
(74) *Attorney, Agent, or Firm*—Foley & Lardner LLP (57) ABSTRACT

A mechanical assembly, for regulating the temperature of an electronic device, includes a gimbal and a heat-exchanger which is attached to the gimbal. The gimbal includes a base member, a carrier member, and a spring which has—1) a first end with a rigid coupling to one of the base and carrier members, and 2) a second end with a slideable coupling to the remaining member. The slideable coupling prevents any gap from occurring between the heat-exchanger and the electronic device when they are pressed together.

14 Claims, 10 Drawing Sheets

Figure 3 eq. 2 → $M_1' = F_2'd_2' = (k_y)(\Delta Y')d_2'$ eq. 3 → $M_2 = F_3d_3 + F_4d_4 = \underbrace{F_3d_3 + (k_x)(\Delta X)d_4}_{52}$ eq. 4 → $M_1' = M_2$ eq. 5 → $(k_y)(\Delta Y')(d_2') - (k_x)(\Delta X)(d_4) > 0$

(Fixed Spring Prob.) *Figure 7*

(Single Bearing Prob.)
*Figure 8*

MECHANICAL ASSEMBLY FOR REGULATING THE TEMPERATURE OF AN ELECTRONIC DEVICE, HAVING A SPRING WITH ONE SLIDEABLE END

BACKGROUND OF THE INVENTION

This invention relates to a mechanical assembly that regulates the temperature of an integrated circuit chip (IC-chip) by pressing a temperature controlled heat-exchanger against a planar surface of the IC-chip.

One particular use for the above mechanical assembly is in a chip testing system. There, test signals are sent to the IC-chip while the mechanical assembly maintains the temperature of the IC-chip at a set point.

In the prior art, one mechanical assembly which regulates the temperature of an IC-chip is shown in FIGS. 1 and 2 of U.S. Pat. No. 4,791,983. The mechanical assembly in patent '983 includes a coil spring 20 which presses a planar surface of a liquid cooling jacket 15 against a planar surface of the IC-chip 11. Squeezing those two planar surfaces together enables heat to flow by thermal conduction from the IC-chip 11 to the liquid cooling jacket 15.

But due to various manufacturing tolerances, the planar surface of the IC-chip in a chip testing system can be oriented at different angles relative to a nominal position. To accommodate these different angles, the mechanical assembly in patent '983 includes a guidepost 18 which has one end that is rigidly attached to the cooling jacket 15, and has an opposite end that pivots on a frame 14. The coil spring 20 is coiled around the guidepost 18. Thus the guidepost 18, together with the coil spring 20 and the cooling jacket 15, can tilt at different angles.

After initial contact occurs in patent '983 between the planar surface of the cooling jacket 15 and one edge of the IC-chip 11, the guidepost 18 must pivot on the frame 14 to make the cooling jacket 15 lie flat against the IC-chip 11. However, the present inventors have determined that as the guidepost 18 pivots on the frame 14, the spring 20 can exert a lateral force on the cooling jacket 15 which may cause a gap to occur between the IC-chip 10 and the planar surface of the cooling jacket. When this gap occurs, the IC-chip 10 will not be adequately cooled. This lateral force problem is analyzed herein in detail in conjunction with the Detailed Description of FIGS. 4 and 7.

Also in the prior art, another mechanical assembly which regulates the temperature of an IC-chip is shown in FIGS. 10 and 11 of U.S. Pat. No. 6,116,331. This mechanical assembly includes a single leaf spring 80 which presses a planar surface 91 of a heat-exchanger 90 against a planar surface of an IC-chip.

However, the leaf spring 80 in patent '331 lies parallel to the planar surface 91 of the heat-exchanger 90, and that leaf spring must have a certain length in order to have the proper flexibility. If the leaf spring 80 is too short, it will be so stiff that the heat-exchanger 91 will press against the IC-chip with too much force and thereby damage the IC-chip.

But as the length of the leaf spring 80 is increased, the density with which multiple copies of the mechanical assembly can be arranged side-by-side in a chip testing system is decreased. Thus, the total number of IC-chips which can be tested concurrently per unit area in a chip testing system is decreased.

Accordingly, a primary object of the present invention is to provide an improved mechanical assembly for regulating the temperature of an IC-chip in which all of the above drawbacks with the prior art are overcome.

BRIEF SUMMARY OF THE INVENTION

The present invention is a mechanical assembly for regulating the temperature of an electronic device. This mechanical assembly includes a gimbal which has a base member and a carrier member that is loosely held by the base member such that the carrier member can tilt and move relative to the base member by predetermined distances. This mechanical assembly also includes a heat-exchanger that is attached to the carrier member and which has a face for pressing against the electronic devices. The mechanical assembly further includes a spring, between the base and carrier members, which is in compression and urges the carrier member away from the base member.

The above spring has a first end with a rigid coupling to only one of the base and carrier members, and has a second end with a slideable coupling to the remaining member. In one preferred embodiment, the slideable coupling includes a plate that has—a) one face which is attached to the second end of the spring, and b) an opposite face with indentations which hold three ball bearings. These ball bearings roll on a surface of the remaining member of the gimbal.

Since the ball bearings roll on the surface of the remaining member of the gimbal, any force which the ball bearings exert on that member will be essentially perpendicular to its surface. This is important because any non-perpendicular force will tend to prevent the heat-exchanger from lying flatly against the electronic device. A mathematical analysis of why this is so is described herein in conjunction with FIGS. 3 and 4.

DETAILED DESCRIPTION

Figure 1:
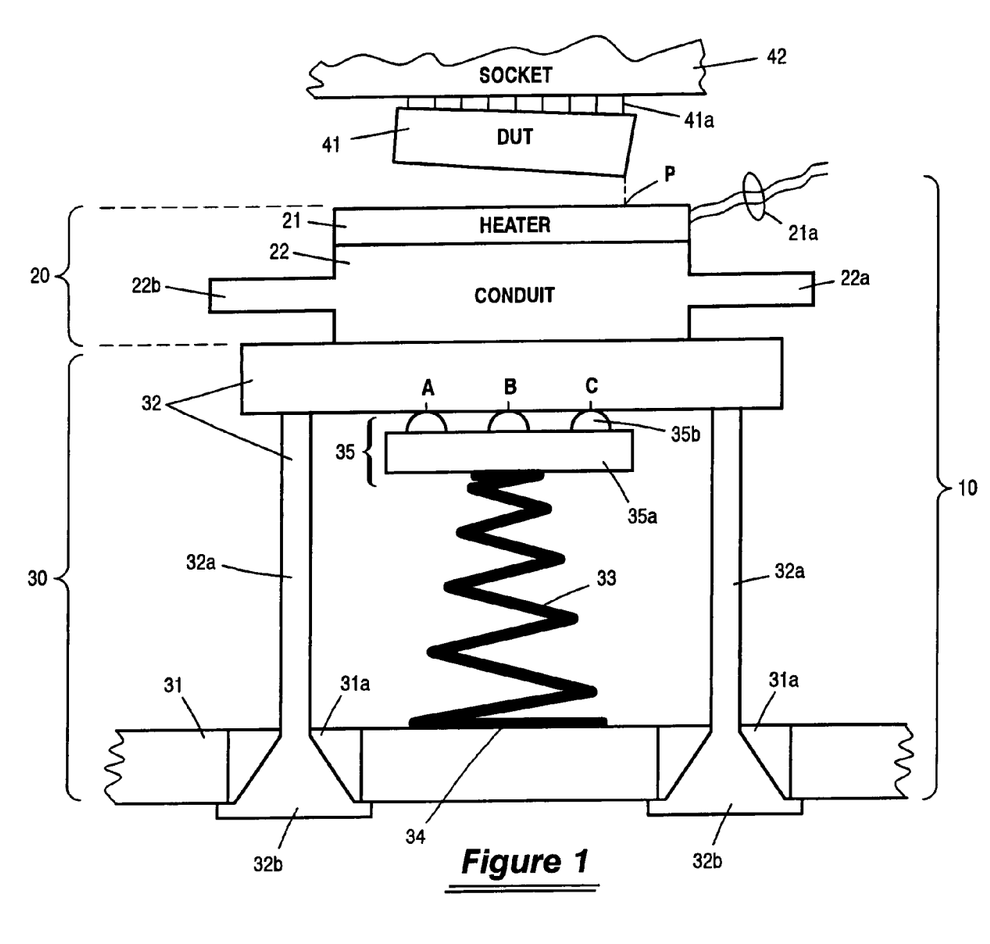
FIG. 1 shows one preferred embodiment of the present invention while that embodiment is in a quiescent state where it is spaced apart from a DUT (device under test).

With reference now to FIGS. 1-6, one particular mechanical assembly 10 will be described which constitutes one preferred embodiment of the present invention. This mechanical assembly 10 consists of a heat-exchanger 20 and a gimbal 30 which are permanently attached to each other, as shown in FIG. 1.

Inspection of FIG. 1 shows that the heat-exchanger 20 includes a thin flat electric heater 21 and a conduit 22 which is permanently attached to the heater 21. The heater 21 has a pair of terminals 21a for passing electrical current through the heater. The conduit 22 has an input port 22a and an output port 22b for passing a liquid coolant through the conduit.

FIG. 1 also shows that the gimbal 30 includes a base 31, a carrier 32, and a coiled spring 33. The carrier 32 is loosely held by the base 31 such that the carrier can tilt and move away from the base 31 within a predetermined range of distances. In the FIG. 1 implementation, the carrier 31 is provided with three legs 32a, only two of which are shown. Each leg 32a extends loosely through a respective hole 31a in the base 31. Also, each leg 32a has an end 32b which is too wide to pass through its respective hole 31a.

FIG. 1 also shows that the coiled spring 33 is interposed between the base 31 and the carrier 32. This coil spring 33 is in compression such that it urges the carrier 32 away from the base 31. In its quiescent state, the spring 33 presses the wide end of each leg 32a against the base 31. This centers the heat-exchanger 20 over the base 31 such that the heater 21 is at a predetermined position.

FIG. 1 further shows that the coiled spring 33 has a first end with a fixed coupling 34 to the base 31, and a second end with a slideable coupling 35 to the carrier 32. In the FIG. 1 embodiment, the slideable coupling 35 includes a plate 35a and three ball bearings 35b.

One surface of the plate 35a is rigidly attached to the spring 33. The opposite surface of the plate 35a holds each of the ball bearings 35b in a respective indentation. All of the ball bearings 35b are pressed by the plate 35a against the carrier 32. Also, all of the ball bearings 35b roll on the carrier 32 and slip in their respective indentation in the plate 35a.

One particular use for the above described mechanical assembly 10 is to regulate the temperature of an integrated circuit chip (IC-chip) while the IC-chip is being tested in a chip testing system. An IC-chip which is being tested in a chip testing system is commonly called a "DUT", which means "device under test". One DUT is shown in FIG. 1 as item 41. This DUT 41 has input/output terminals 41a that are held by a socket 42 in the chip testing system.

The DUT 41 can be an IC-chip by itself, and in that case the terminals 41a extend directly from the IC-chip. Alternatively, the DUT 41 can be the combination of an IC-chip plus a substrate which is attached to the IC-chip. In that case, the terminals 41a extend from the substrate. When the DUT includes a substrate, the DUT 41 can also include a cover which encloses the IC-chip and is attached to the substrate.

Initially in a chip testing system, the mechanical assembly 10 is positioned spaced-apart from the DUT 41, as shown in FIG. 1. In that spaced-apart position, the DUT 41 and the heater 21 will ideally lie in parallel planes. However, due to various tolerances in multiple components within the chip testing system, the DUT 41 and the heater 21 will almost always lie at an unpredictable angle with respect to each other. For example, FIG. 1 shows that the DUT 41 may be tilted in the socket 42. As another example, FIG. 1 also shows that the DUT 41 may have a non-uniform thickness.

From the spaced-apart position that is shown in FIG. 1, the mechanical assembly 10 is moved up, or the DUT 41 is moved down, by a predetermined distance in the vertical direction. This vertical movement can be performed by any prior art positioning mechanism (not shown) such as a robotic arm. As this vertical movement occurs, the heater 21 initially contacts one edge of the DUT 41. Then as the vertical movement continues, the gimbal 30 and the attached heat-exchanger 20 tilt such that the heater 21 can lie flat against the DUT 41.

Figure 2:
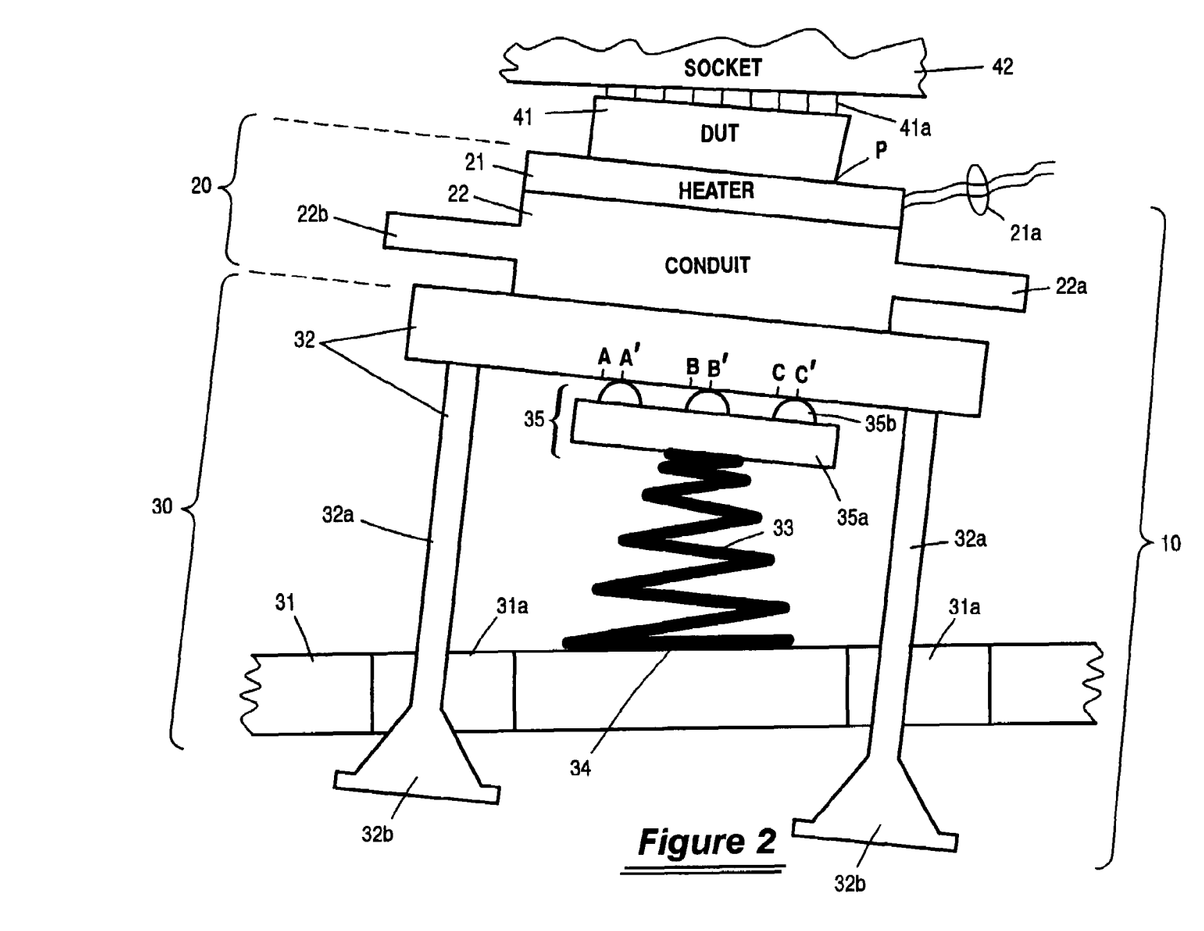
FIG. 2 shows the preferred embodiment of FIG. 1 while a heat-exchanger in that embodiment is pressed flatly against the DUT.

FIG. 2 shows the position of the heat-exchanger 20, the gimbal 30, and DUT 41 after the above vertical movement is complete. In FIG. 2, the spring 33 is compressed by a force which the positioning mechanism exerts against the base 31 in an upward direction, or against the DUT 41 in the downward direction. Consequently, the wide end 32b of each carrier leg 32a has moved away from the base 31, and that allows the carrier 32 plus the heat-exchanger 20 to tilt.

However, in order for the carrier 32 plus the heat-exchanger 20 to tilt so much that the heater 21 lies flat against the DUT 41, the slideable coupling 35 on the coil spring 33 must slide relative to the carrier 32 from the initial position shown in FIG. 1 to another position shown in FIG. 2. In FIG. 1, the initial position of the ball bearings 35b is labeled A, B, C, and in FIG. 2 the new position of ball bearings 35b is labeled A', B', C'. As this sliding occurs, the spring 33 stays essentially vertical and the slideable coupling 35 stays essentially centered with the vertical axis of the spring 33.

Figure 3:
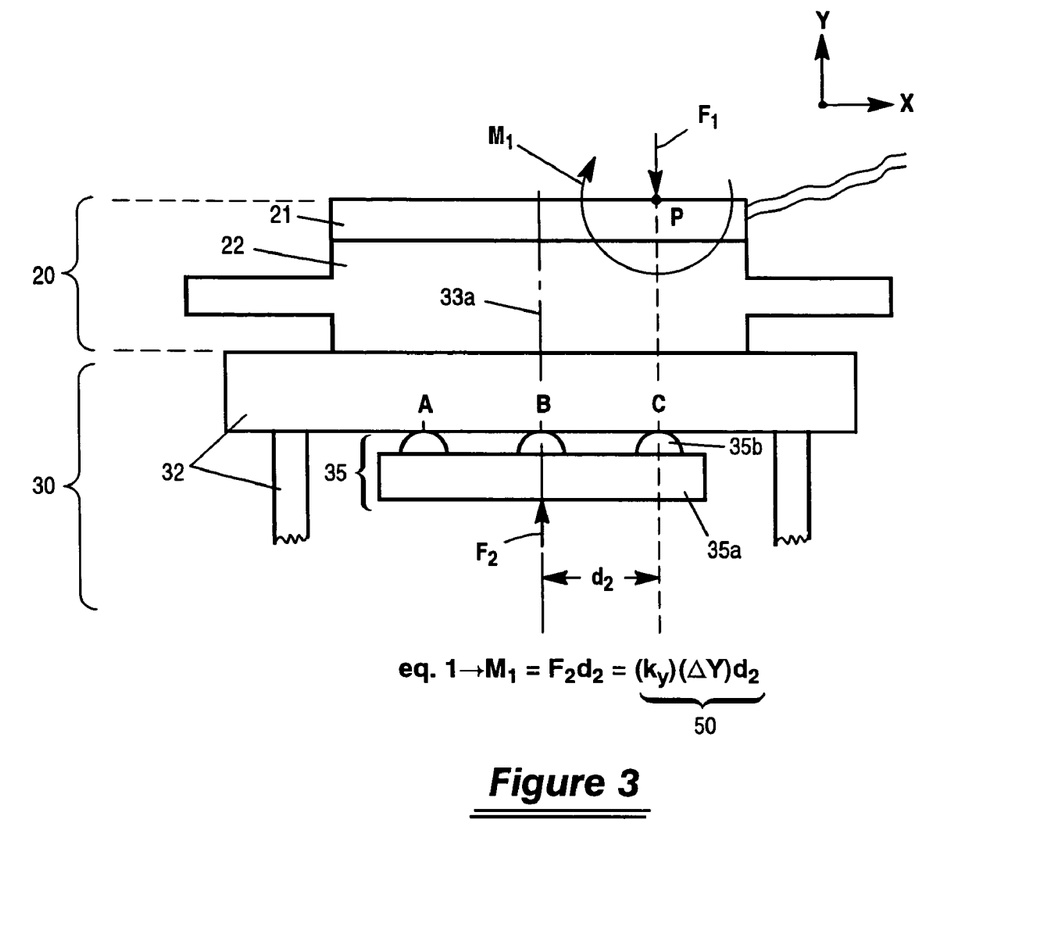
FIG. 3 analyzes various forces and moments which occur in the preferred embodiment of FIG. 1 when that embodiment initially contacts the DUT.
Figure 4:
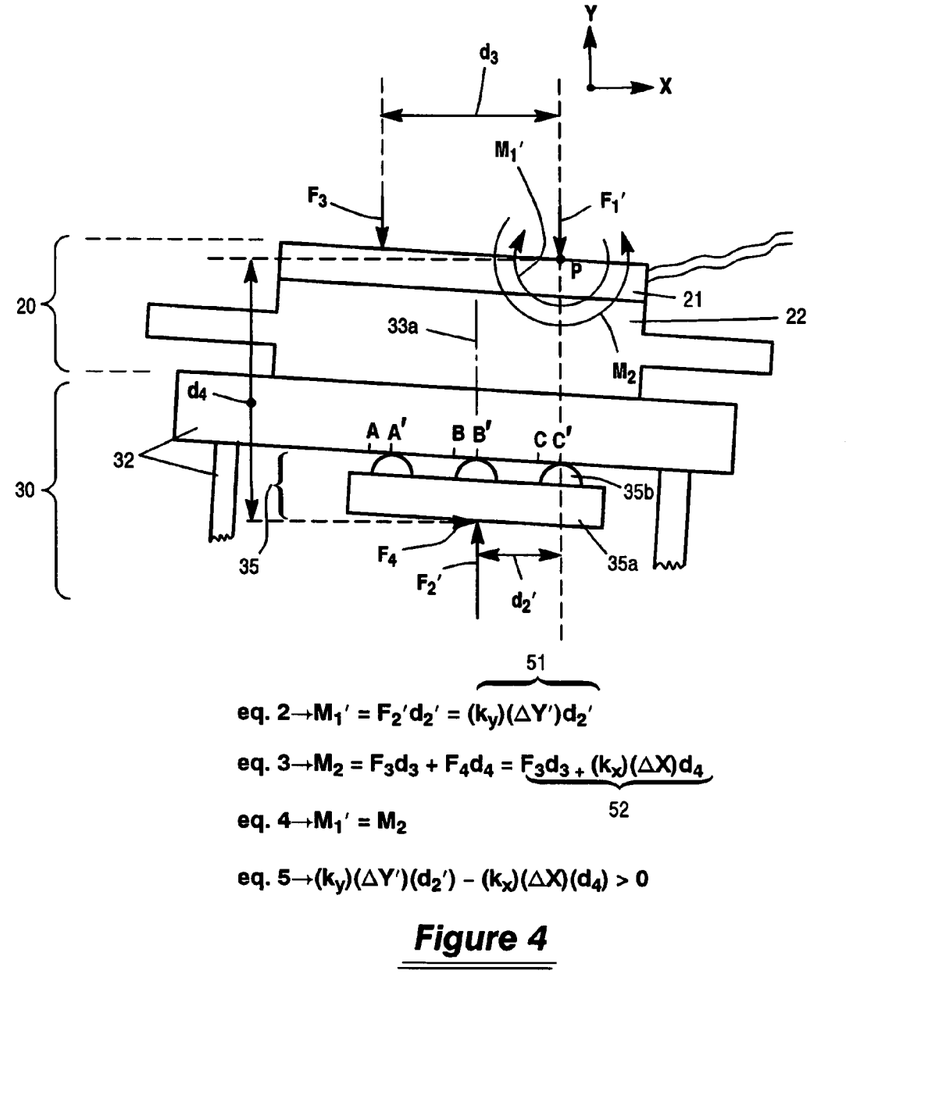
FIG. 4 analyzes various forces and moments which occur in the preferred embodiment of FIG. 1 when the heat-exchanger in that embodiment is pressed flatly against the DUT.

To closely analyze the forces and moments which cause the slideable coupling 35 to move, reference should now be made to FIGS. 3 and 4. In FIG. 3, two forces $F_1$ and $F_2$ are exerted as shown on the heat-exchanger 20 and the gimbal 30, respectively. This occurs at the time instant when one edge of the DUT 41 initially contacts the heater 21. The force $F_2$ generates a clockwise moment $M_1$ about point P.

By comparison in FIG. 4, four forces $F_1'$, $F_2'$, $F_3$ and $F_4$, are exerted as shown on the heat-exchanger 20 and the gimbal 30. This occurs at the time instant when the vertical movement of the DUT 41 toward the mechanical assembly 10 has been completed by the handler mechanism. The force $F_2'$ generates a clockwise moment $M_1'$ about point P, whereas the forces $F_3$ and $F_4$ generate a counter-clockwise moment $M_2$ about point P.

In FIG. 3, the force $F_1$ is exerted by the one edge of the DUT 41 that initially contacts the heater 21. This force is shown as occurring in the $-Y$ direction at a point P.

Also in FIG. 3, the force $F_2$ is exerted by the spring 33. This force is shown as occurring in the $+Y$ direction in alignment with the central axis 33a of the spring 33. The forces $F_1$ and $F_2$ are separated in the X direction by a distance $d_2$. Consequently, the force $F_2$ produces the moment $M_1$ in the clockwise direction around the point P.

A mathematical expression 50 for the moment $M_1$ is derived by equation 1 in FIG. 3. In the expression 50, $k_y$ is the spring constant in the Y direction for the spring 33. Also in the expression 50, $\Delta Y$ is the amount by which the spring 33 is compressed in the Y direction from its undeformed length. Further in the expression 50, the product $(k_y)(\Delta Y)$ is the force $F_2$ which is exerted by the spring 33. When the assembly 10 is in the state shown in FIG. 1, a small $\Delta Y$ produces a preload force $F_2$ that keeps the wide ends 32b of the carrier legs 32a pressed against the base 31.

Due to the moment $M_1$, the gimbal 30 and the attached heat-exchanger 20 start to rotate in a clockwise direction. This rotation occurs about point P because at that point the heater 21 is held by friction against the edge of the DUT 41. As this rotation occurs, another moment $M_2$ is generated, as shown in FIG. 4, which opposes the rotation.

As the gimbal 30 and the attached heat-exchanger 20 rotate clockwise, the ball bearings 35b move relative to the carrier 32 from the positions A, B, C to the positions A', B', and C'. This is shown in FIG. 4.

In FIG. 4, two forces $F_1'$ and $F_3$ are exerted on the heater 21 by the DUT 41. The force $F_1'$ occurs at the initial point of contact P. The force $F_3$ occurs at the opposite edge of the DUT 41, which is at a distance $d_3$ in the −X direction from point P.

Note that in actuality, the DUT 41 will exert a distributed force against the heater 21 at all points where the DUT 41 contacts the heater 21. However, to simplify the present analysis, this distributed force is replaced in FIG. 4 with the two equivalent point forces $F_1'$ and $F_3$.

Also in FIG. 4, two forces $F_2'$ and $F_4$ are exerted on the slideable coupling 35 by the spring 33. The force $F_2'$ is due to the spring 33 being compressed to a new amount $\Delta Y'$ in the Y direction. The force $F_4$ is due to the spring 33 being deflected by an amount $\Delta X$ in the X direction at the point where spring 33 connects to the slideable coupling 35. The deflection $\Delta X$ occurs as the carrier 32 and the attached heat-exchanger 20 rotate clockwise about point P.

In FIG. 4, the force $F_2'$ produces the clockwise moment $M_1'$ around the point P. A mathematical expression 51 for the moment $M_1'$ is derived by equation 2 in FIG. 4.

Also in FIG. 4, the forces $F_3$ and $F_4$ produce the counter-clockwise moment $M_2$ around the point P. A mathematical expression 52 for the moment $M_2$ is derived by equation 3 in FIG. 4. In the expression 52, $k_x$ is the spring constant for the spring 33 in the X direction.

When the mechanical assembly 10 is in a state of equilibrium in FIG. 4, the moments $M_1'$ and $M_2$ are equal in magnitude. This is stated by equation 4 in FIG. 4. When that occurs, the expression 51 equals the expression 52.

Also when expression 51 equals expression 52, the force $F_3$ must be greater than zero. Otherwise, the DUT 41 will not be pressing flatly against the heater 21. Therefore, setting expression 51 equal to expression 52, and setting force $F_3$ to be greater than zero, yields equation 5. This equation must be satisfied in order for the DUT 41 to lie flat against the heat-exchanger 20.

In equation 5, the term $(k_x)(\Delta X)$ is the horizontal force $F_4$ which the spring 33 exerts on the plate 35a. Also in equation 5, the term $(k_y)(\Delta Y')$ is the vertical force $F_2'$ which the spring 33 exerts on the plate 35a. These forces $F_4$ and $F_2'$ are shown in FIG. 4.

However, the same two forces $F_4$ and $F_2'$ are also exerted by the ball bearings 35b on the underside of the carrier 32 when any friction against the ball bearings is negligible. And, since the ball bearings 35b can roll on the carrier 32, the vector sum of the two forces $F_4$ and $F_2'$ must be perpendicular to the surface of the carrier 32 at the points A', B', C'. Otherwise, the ball bearings 35b will roll from those points.

Thus it follows that the horizontal force $F_4$ will always be small whenever the carrier 32 rotates by only a small angle in order for the DUT 41 to lie flat against the heater 21. This means that the term $(k_x)(\Delta X)$ in equation 5 will always be small. Consequently the condition which must be satisfied in order for the DUT 41 to lie flat against the heater 21 (as expressed by equation 5) is easily met.

It is important to realize that equation 5 cannot be met by simply making various terms in that equation larger or smaller, as desired. For example, the force $(k_y)(\Delta Y')$ cannot be made so large that damage will occur to the DUT 41. Also, the distance $d_2'$ cannot be made larger than one-half the width of the DUT 41. Further, the distance $d_4$ cannot be made so small that there is no room for the heater 41, the conduit 22, and the carrier 32. In addition, as the overall length of the spring 33 is decreased in order to reduce the total height of the assembly 10, the spring 33 becomes stiffer, which increases $k_x$. But, with the present invention, all of these practical limitations are overcome by the slideable coupling 35 which causes $\Delta X$ to be small in equation 5.

Next, with reference to FIGS. 5 and 6, additional details regarding the slideable coupling 35 will be described. These figures show that the plate 35a has three indentations 35c. In the illustrated preferred embodiment, each indentation 35c has a semi-spherical shape with a radius that is larger than the radius of the ball bearings 35b. One respective ball bearing 35b lies in each indentation 35c.

Preferably, the plate 35a and the ball bearings 35b are made of materials that easily slip on each other. In one particular embodiment, the plate 35a is made of a plastic such as Teflon, and the ball bearings 35b are made of a metal such as steel.

Also in the illustrated preferred embodiment, the indentations 35c are spaced at equal distances from each other. These indentations 35c have a geometric center 35d on the plate 35a. The geometric center 35d on the plate 35a will be close to, but slightly offset from, the central axis 33a of the spring 33, as shown in FIG. 5. This offset is caused by various tolerances with which the entire mechanical assembly 10 can be manufactured.

Figure 7:
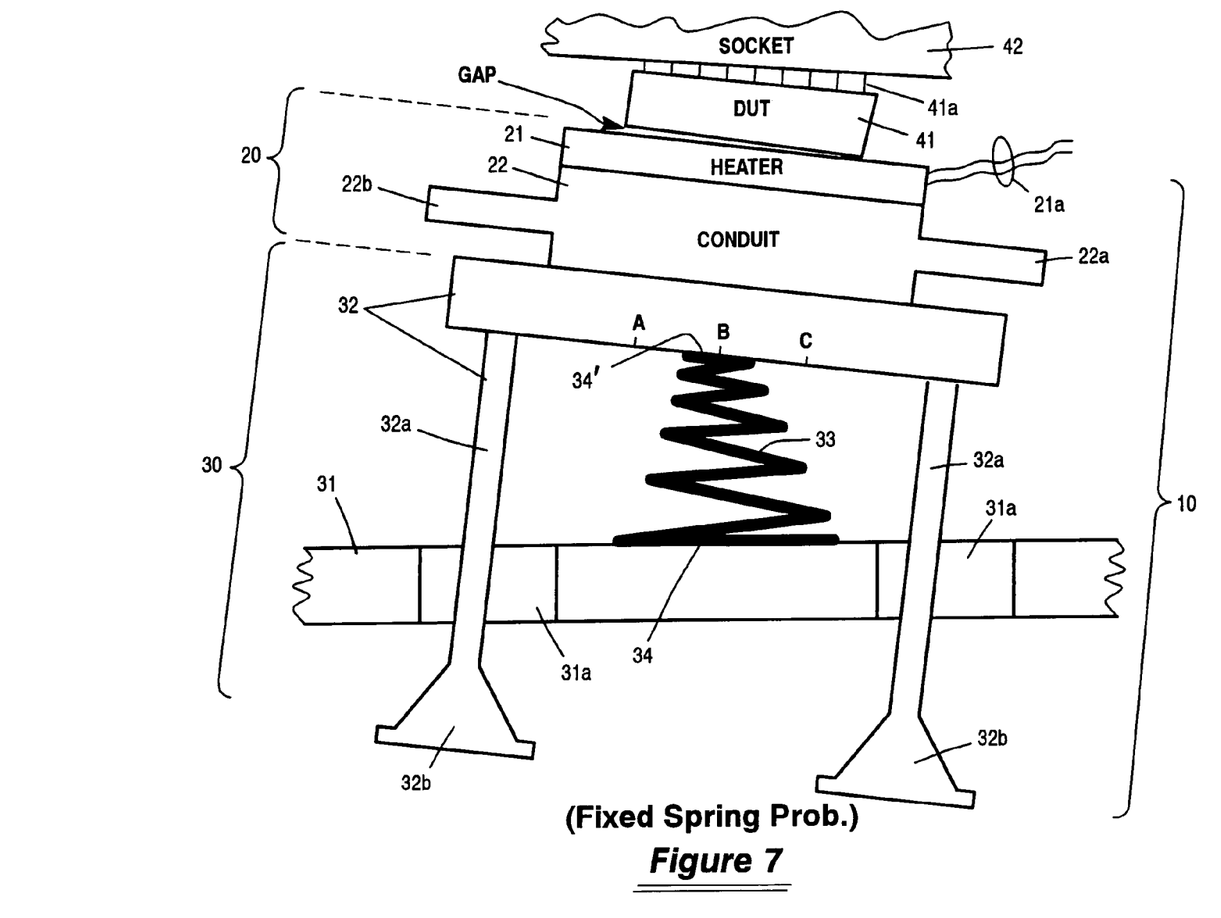
FIG. 7 shows one non-workable modification, for comparison purposes, to the preferred embodiment of FIG. 1.

Suppose now, for comparison purposes, that the slideable coupling 35 in FIGS. 1 and 2 is replaced with a rigid coupling 34' between the spring 33 and the carrier 32. This change is shown in FIG. 7. All other components in the assembly 10 of FIG. 7 are the same as the components which have corresponding reference numerals in FIGS. 1 and 2.

In FIG. 7, the DUT 41 is being pressed against the heater 21; however, the DUT 41 is not lying flat against the heater 21. Instead in FIG. 7, only one edge of the DUT 41 presses against the heater 21 at the initial point of contact.

When the DUT 41 in FIG. 7 contacts the heater 21, the gimbal 30 starts to rotate in the clockwise direction due to the moment $M_1'$ that was previously described in conjunction with FIG. 4. But that clockwise rotation is opposed by the counter clockwise moment $M_2$ that also was previously described in conjunction with FIG. 4.

One of the terms in the moment $M_2$ was shown by equation 3 of FIG. 4 to be $(F_4)(d_4)$, where $F_4$ is the horizontal force that is exerted by the spring 33. That horizontal force $F_4$ is limited in the embodiment of FIGS. 1-2 by the presence of the ball bearings 35b. However, with the change that is made in FIG. 7, the ball bearings 35b are eliminated; and consequently, the horizontal force $F_4$ which the spring 33 can exert on carrier 32 is not limited.

Thus in FIG. 7, the counter clockwise moment $M_2$ balances the clockwise moment $M_1'$ before the DUT 41 lies flat against the heater 21. In other words, the moments $M_2$ and $M_1'$ balance while the force $F_j$ is zero. This results in a gap between the DUT 41 and the heater 21. Due to this gap, the temperature of the DUT 41 cannot be regulated accurately by the heat-exchanger 20.

Figure 5:
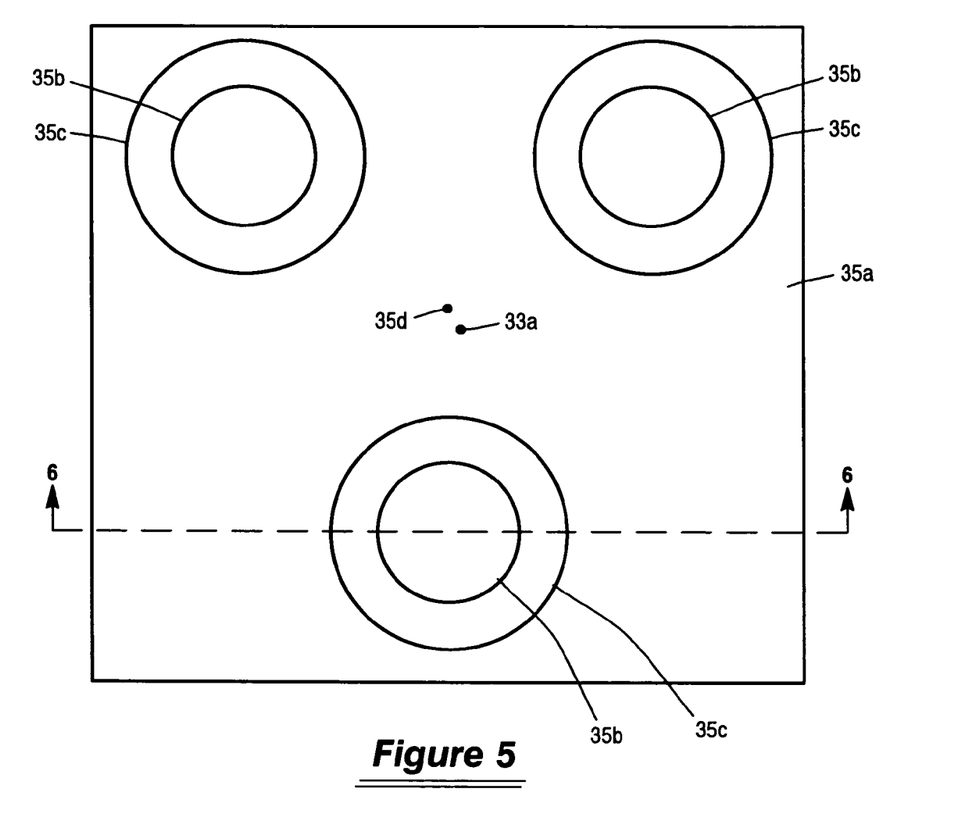
FIG. 5 shows a top view of a plate which is holding three ball bearings in the preferred embodiment of FIG. 1.
Figure 6:
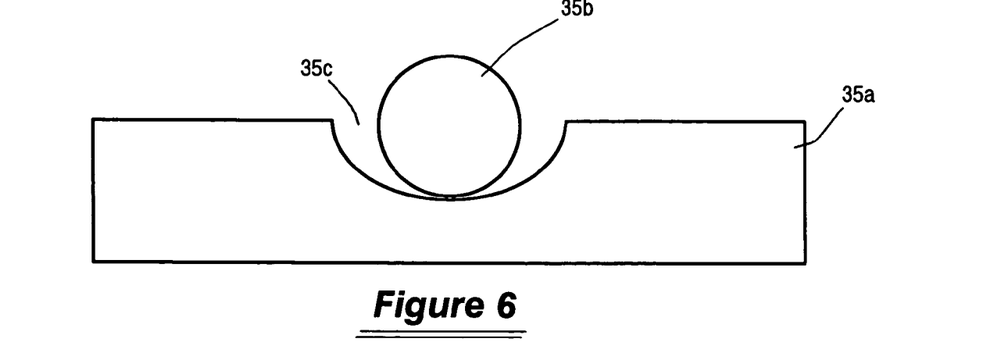
FIG. 6 shows a sectional view of the plate and one ball bearing in FIG. 5.
Figure 8:
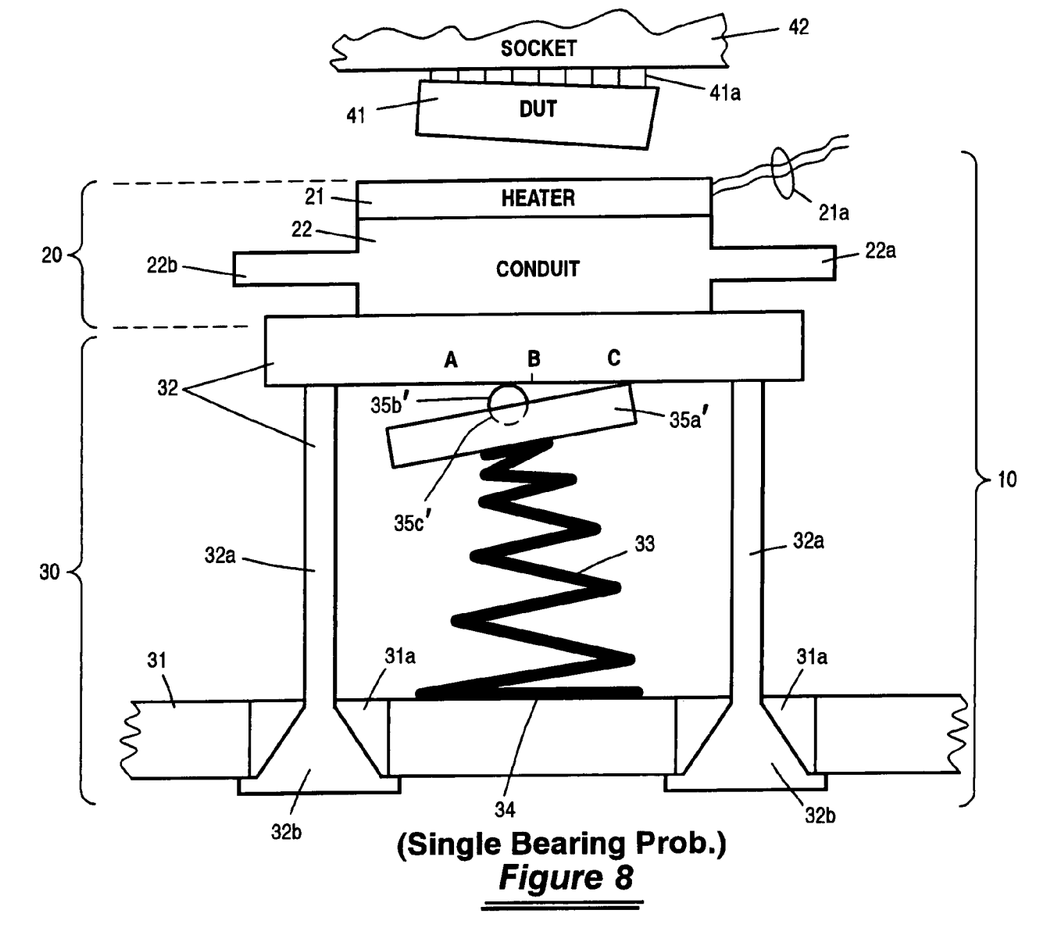
FIG. 8 shows another non-workable modification, for comparison purposes, to the preferred embodiment of FIG. 1.

Next for comparison purposes, suppose that the plate 35a of FIGS. 5 and 6 is replaced in the assembly 10 with a different plate 35a' which has only a single indentation 35c' at its geometric center that holds a single ball bearing 35b'. This change is shown in FIG. 8. All of the other components in the assembly 10 of FIG. 8 are the same as the components which have corresponding reference numerals in FIG. 1.

In FIG. 8, the spring 33 is in compression, and the DUT 41 is not exerting any force on heater 21. Thus in FIG. 8, the wide end 32b of each leg 32a in the carrier 32 presses against the base 31, and the single ball bearing 35b' presses against the carrier 32.

However, when the single ball bearing 35b' in FIG. 8 presses against the carrier 32 at a slight offset from the central axis of the spring 33, the position of the ball bearing 35b' is unstable. That is because the ball bearing 35b' will roll on the base 32 unless the ball bearing 35b' is in perfect alignment with the central axis 33a of the spring 33. But from the prior description of FIGS. 5-6 it is evident that the single ball bearing 35b' will virtually never be perfectly aligned with the axis 33a of the spring 33.

Once the single ball bearing 35b' starts to roll on the carrier 32, that movement will continue until one edge of the plate 35a' hits the carrier 32. Then movement of the ball bearing 35b' will stop due to friction between the plate 35a' and carrier 32. This position for the ball bearing 35b' and the plate 35a' is shown in FIG. 8.

But if the ball bearing 35b' cannot move on the carrier 32, the connection between the spring 33 and the carrier 32 is in effect fixed just like it is in FIG. 7. Thus, a gap will occur between the DUT 41 and the heater 21 when the DUT 41 is pressed against the heater 21.

Next, with reference to FIG. 9, one modification to the mechanical assembly 10 of FIGS. 1-4 will be described. In this FIG. 9 modification, the spring 33 together with the rigid coupling 34 and the slideable coupling 35 are rotated 180°. Thus in FIG. 9, the spring 33 has a fixed coupling 34 to the carrier 32 (instead of the base 31), and the spring 33 has a slideable coupling 35 to the base 31 (instead of the carrier 32).

Figure 9:
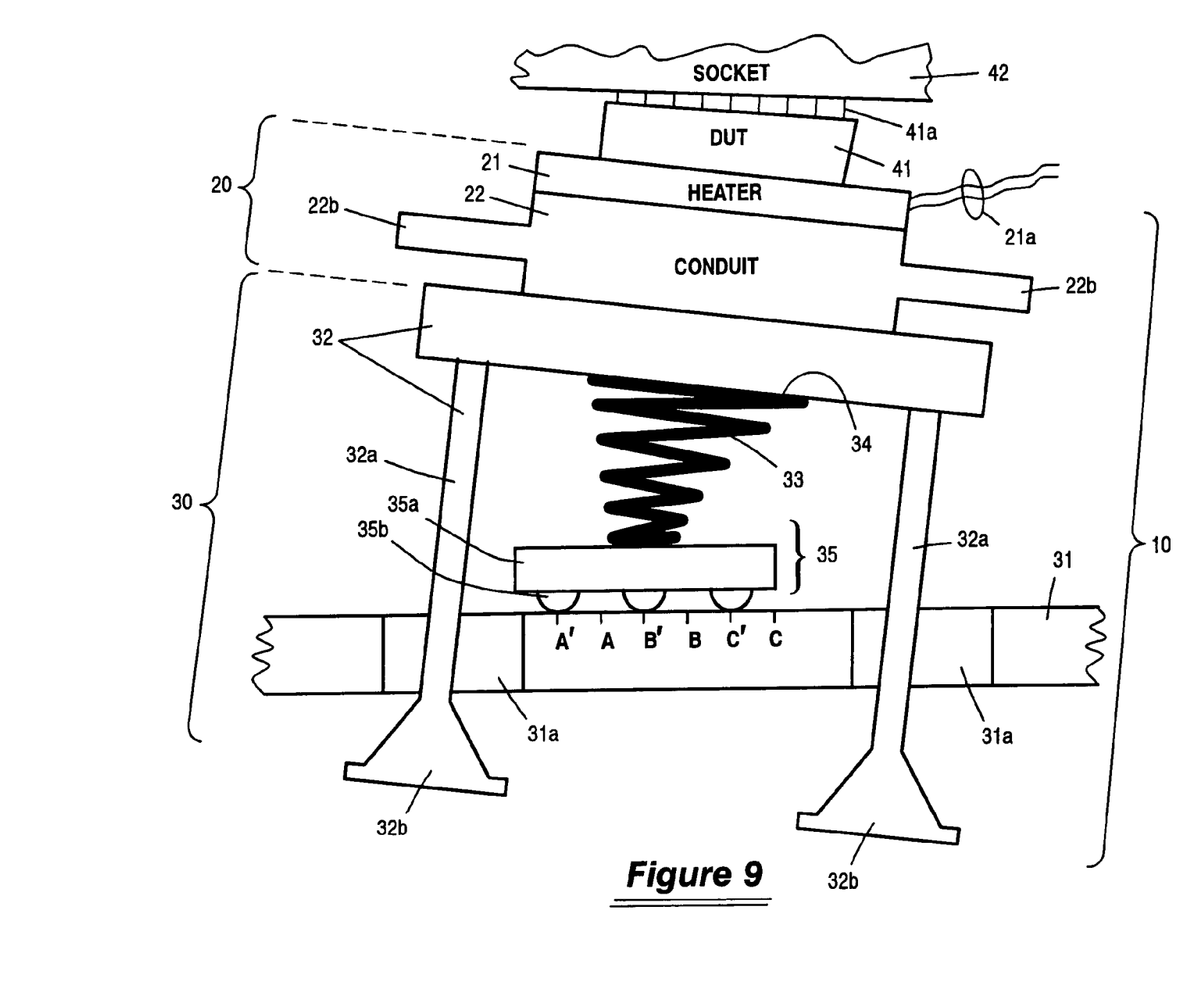
FIG. 9 shows one workable modification to the preferred embodiment of FIG. 1.

All of the remaining components in the FIG. 9 modification are the same as they are in the mechanical assembly 10 of FIGS. 1-4. Those remaining components in the FIG. 9 modification are identified with the same reference numerals that they have in FIGS. 1-4.

When the modified embodiment of FIG. 9 is in a quiescent state, the DUT 41 is spaced apart from the electric heater 21. Thus, the wide ends 32b of the legs 32a are pressed against the base 31 due to the force exerted on the carrier 32 by the spring 33. Also in that quiescent state, the ball bearings 35b are at the positions A, B, C on the base 31, as labeled in FIG. 9.

Thereafter, the DUT 41 and the mechanical assembly 10 are moved towards each other by a predetermined distance in the vertical direction. FIG. 9 shows the position of the heat-exchanger 20, the gimbal 30, and the DUT 41 after this vertical movement is complete.

In FIG. 9, the heater 21 lies flat against the DUT 41, and the ball bearings 35b have moved from the positions A, B, C to the positions A', B', C'. This movement of the ball bearings 35b is caused by forces and moments which are similar to those that where previously analyzed in conjunction with FIGS. 3-4.

Next, with reference to FIGS. 10 and 11, a second modification to the mechanical assembly 10 of FIGS. 1-4 will be described. In this modification, the slideable coupling 35 of FIGS. 1-4 is replaced with a solid plate 35'. The plate 35' has one face that is rigidly attached to the spring 33 and an opposite face that has a small coefficient of friction such that it easily slides on the carrier 32.

Figure 10:
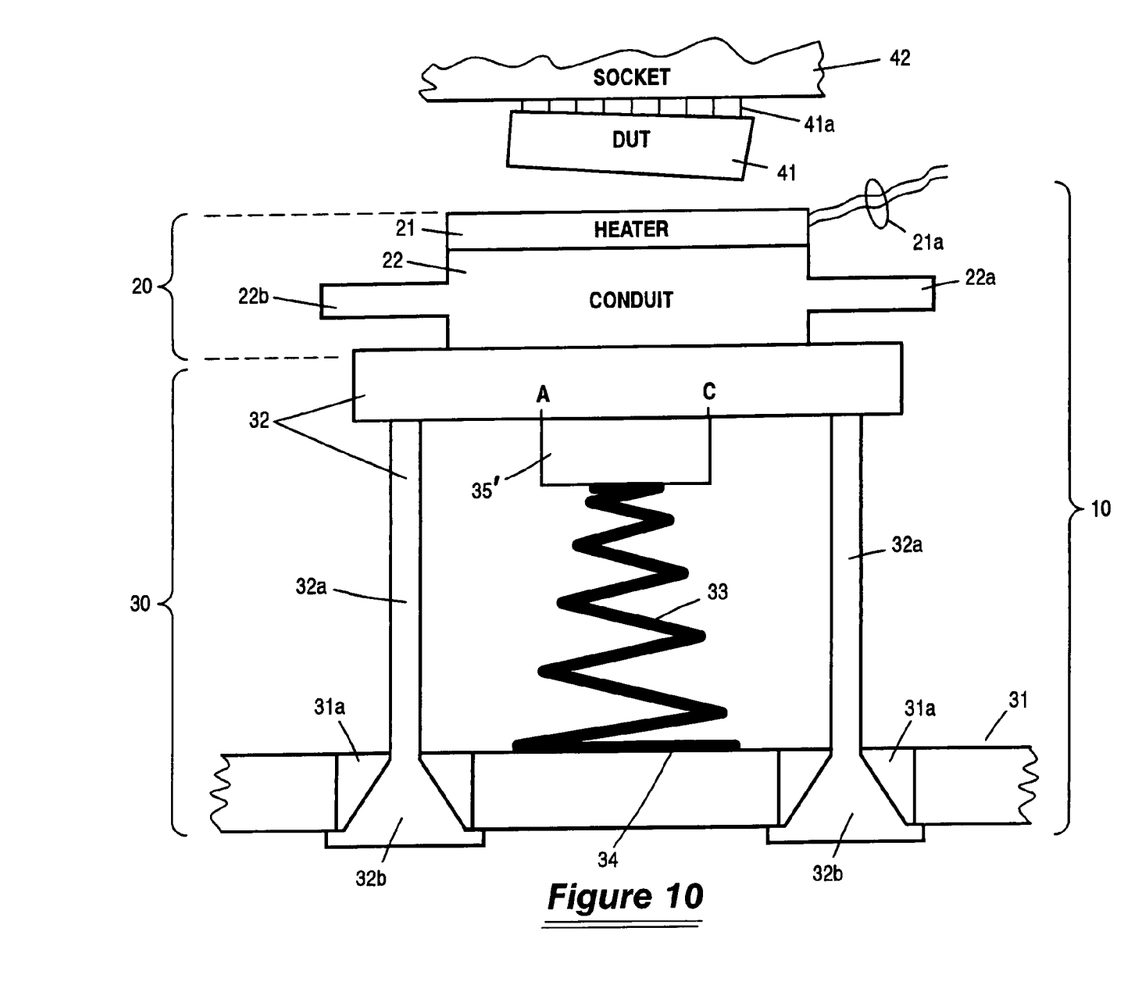
FIG. 10 shows another workable modification to the preferred embodiment of FIG. 1, while that modification is in an inactive state.
Figure 11:
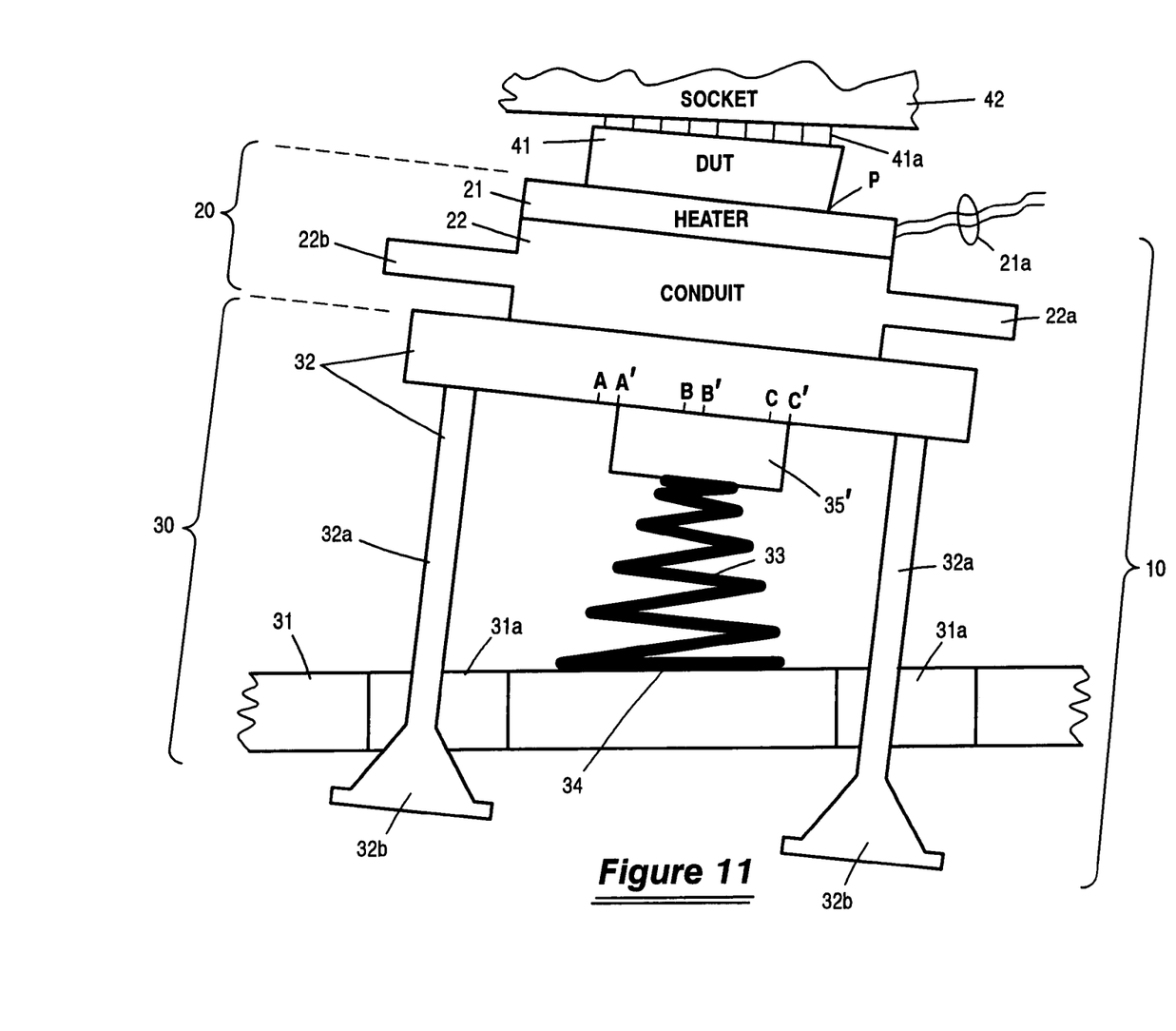
FIG. 11 shows the modification of FIG. 10, while that modification is in an active state.

All of the remaining components in the modification of FIGS. 10-11 are the same as they are in the mechanical assembly 10 of FIGS. 1-4. These remaining components in the modification of FIGS. 10-11 are identified with the same reference numerals that they have in FIGS. 1-4.

When the modified embodiment of FIGS. 10-11 is in a quiescent state, the DUT 41 is spaced apart from the electric heater 21. Thus, the wide ends 32b of the legs 31a are pressed against the base 31 due to the force exerted on the carrier 32 by the spring 33. Also in that quiescent state, the edges of the solid plate 35' are at the positions A and C on the base 31, as shown in FIG. 10.

Thereafter, the DUT 41 and/or the mechanical assembly 10 are moved towards each other by a predetermined distance in the vertical direction. FIG. 11 shows the position of the heat-exchanger 20, the gimbal 30, and the DUT 41 after this vertical movement is complete.

In FIG. 11, the heater 21 lies flat against the DUT 41, and the edges of the plate 35b have moved from the positions A, C to the positions A', C'. This movement of the plate 35b' is caused by forces and moments which are similar to those that where previously analyzed in conjunction with FIGS. 3-4.

One preferred embodiment of the present invention, and two preferred modifications, have now been shown in the figures and described in detail. In addition, however, other modifications can also be made which will now be described with reference to those same figures.

For example, in FIGS. 10 and 11, the spring 33 together with the slideable plate 35b' and the rigid coupling 34 can be rotated 180°. With this modification, the plate 35b' slides on the base 31, whereas the rigid coupling 34 is between the spring 33 and the carrier 32.

As another example, in FIGS. 5 and 6, the indentations 35c and respective ball bearings 35b can be increased to any desired number greater than three. This modification can be incorporated into the assembly 10 of FIGS. 1-2 and/or the assembly 10 of FIG. 9.

As still another example, the rigid coupling 34 between the spring 33 and the plate 35 in FIGS. 1, 2, and 9, can be implemented as desired. In one particular implementation, the spring 33 is welded or brazed to the plate 35. In another implementation, the spring 33 is held to the plate 35 with screws or other similar fasteners. In still another implementation, the spring 33 is held to the plate 35 by protrusions from the plate 35 around the spring, or an indentation in the plate 35, or simply by friction.

As yet another example, the heat-exchanger 20 that is shown in the embodiments of FIGS. 1, 2, 9, 10 and 11 can be replaced with any other type of heat-exchanger. As one such modification, the electric heater 21 can be deleted. In that case, the conduit 22 gets pressed against the DUT 41, instead of the heater 21 getting pressed against the DUT 41. Also, the conduit 22 can be one which passes coolant that stays in a liquid state between the input port 22a and the output port 22b, or the conduit 22 can be one which changes the coolant from a liquid state to a gas state between the input port 22a and the output port 22b.

As still another example, the spring 33 in FIGS. 1, 2, 9, 10 and 11 can be a cylindrical coil spring, instead of the conical coil spring that is shown. Also, the spring 33 in FIGS. 1, 2, 9, 10 and 11 can be one which lies only in the plane of those figures. Such a spring in FIG. 1 could extend upward from the base 31, then loop in the plane of FIG. 1, and then continue upward to the plate 35a. Alternatively, this loop in the plane of FIG. 1 could be replaced with a "C" shaped bend.

As another example, a lubricant can be coated on the ball bearings 35b in FIGS. 5 and 6 in order to reduce any friction which is exerted on those ball bearings. Similarly, a lubricant can be coated on the surface of the plate 35' in FIGS. 10 and 11 in order to reduce any friction which is exerted on that plate by the carrier 32.

Accordingly, it is to be understood that the present invention is not limited to just all the details of one particular embodiment, but is defined by the appended claims.

What is claimed is:

1. A mechanical assembly for regulating the temperature of an electronic device, said mechanical assembly being comprised of:
   a gimbal which includes a base member and a carrier member that is loosely held by said base member such that said carrier member can tilt and move relative to said base member by predetermined distances;
   a heat-exchanger, attached to said carrier member, which has a face for pressing against said electronic device;
   said gimbal further including a spring, between said base and carrier members, which urges said carrier member away from said base member; and,
   said spring having a first end with a rigid coupling to only one of said base and carrier members, and having a second end with a slideable coupling to the remaining member.

2. A mechanical assembly according to claim 1 wherein said slideable coupling includes a plate which is attached to said second end of said spring and which has a surface with at least three ball bearings that roll on said remaining member and slide on said plate.

3. A mechanical assembly according to claim 2 wherein said one member with said rigid coupling is said base member, and said remaining member with said slideable coupling is said carrier member.

4. A mechanical assembly according to claim 2 wherein said one member with said rigid coupling is said carrier member, and said remaining member with said slideable coupling is said base member.

5. A mechanical assembly according to claim 2 wherein said spring is a coiled conical spring.

6. A mechanical assembly according to claim 2 wherein said spring is a coiled cylindrical spring.

7. A mechanical assembly according to claim 2 wherein said spring lies in a single plane between said base and carrier members.

8. A mechanical assembly according to claim 2 wherein said ball bearings are in respective indentations in said surface of said plate.

9. A mechanical assembly according to claim 1 wherein said slideable coupling includes a plate which is attached to said second end of said spring and which has a surface that slides on said remaining member.

10. A mechanical assembly according to claim 9 wherein said one member with said rigid coupling is said base member, and said remaining member with said slideable coupling is said carrier member.

11. A mechanical assembly according to claim 9 wherein said one member with said rigid coupling is said carrier member, and said remaining member with said slideable coupling is said base member.

12. A mechanical assembly according to claim 9 wherein said spring is a coiled conical spring.

13. A mechanical assembly according to claim 9 wherein said spring is a coiled cylindrical spring.

14. A mechanical assembly according to claim 9 wherein said spring lies in a single plane between said base and carrier members.

* * * * *